(12) United States Patent
Reber et al.

(10) Patent No.: US 9,508,701 B2
(45) Date of Patent: *Nov. 29, 2016

(54) 3D DEVICE PACKAGING USING THROUGH-SUBSTRATE PILLARS

(71) Applicant: Freescale Semiconductor, Inc., Austin, TX (US)

(72) Inventors: Douglas M. Reber, Austin, TX (US); Mehul D. Shroff, Austin, TX (US); Edward O. Travis, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 27 days.

This patent is subject to a terminal disclaimer.

(21) Appl. No.: 14/039,622

(22) Filed: Sep. 27, 2013

(65) Prior Publication Data

US 2015/0091178 A1 Apr. 2, 2015

(51) Int. Cl.
*H01L 23/48* (2006.01)
*H01L 23/52* (2006.01)
(Continued)

(52) U.S. Cl.
CPC ............ *H01L 25/50* (2013.01); *H01L 21/304* (2013.01); *H01L 21/76898* (2013.01); *H01L 23/3114* (2013.01); *H01L 23/481* (2013.01); *H01L 24/05* (2013.01); *H01L 24/13* (2013.01); *H01L 24/16* (2013.01); *H01L 24/73* (2013.01); *H01L 24/81* (2013.01); *H01L 24/92* (2013.01); *H01L 24/94* (2013.01); *H01L 25/0657* (2013.01); *H01L 24/14* (2013.01); *H01L 24/48* (2013.01); *H01L 2224/0392* (2013.01); *H01L 2224/0401* (2013.01); *H01L 2224/04042* (2013.01); *H01L 2224/0569* (2013.01); *H01L 2224/05557* (2013.01); *H01L 2224/05568* (2013.01); *H01L 2224/05624* (2013.01);
(Continued)

(58) Field of Classification Search
USPC ................................ 257/E23.169–E23.178, 257/E25.031–E25.032, E23.042, 772, 779, 257/E23.015, E23.02, E23.023–E23.079, 257/678–733, 787–796, 100, 433, 434, 667, 257/E31.117–E31.118, E51.02, 257/E23.116–E23.14, E21.508, E33.066, 257/E23.021, E23.063, 777, 778, 782, 257/E23.174, E33.056, E33.058; 438/6, 28, 438/66, 67, 107, 109, 406, 455–459, 396, 438/124, 15, 613, 614, 652
See application file for complete search history.

(56) References Cited

U.S. PATENT DOCUMENTS

| 5,218,234 A | 6/1993 | Thompson et al. |
| 5,766,982 A | 6/1998 | Akram et al. |

(Continued)

OTHER PUBLICATIONS

Gilles Poupon et al., "From the Single Chip to the Wafer Integration", CEA-LETI Minatec, Gernoble, France, Jan. 2002, 7 pages.
(Continued)

*Primary Examiner* — Tram H Nguyen

(57) ABSTRACT

A method for 3D device packaging utilizes through-substrate pillars to mechanically and electrically bond two or more dice. The first die includes a set of access holes extending from a surface of the first die to a set of pads at a metal layer of the first die. The second die includes a set of metal pillars. The first die and the second die are stacked such that each metal pillar extends from a surface of the second die to a corresponding pad via a corresponding access hole. The first die and second die are mechanically and electrically bonded via solder joints formed between the metal pillars and the corresponding pads.

20 Claims, 5 Drawing Sheets

(51) Int. Cl.
| | |
|---|---|
| *H01L 29/40* | (2006.01) |
| *H01L 25/00* | (2006.01) |
| *H01L 23/31* | (2006.01) |
| *H01L 25/065* | (2006.01) |
| *H01L 21/304* | (2006.01) |
| *H01L 23/00* | (2006.01) |
| *H01L 21/768* | (2006.01) |

(52) U.S. Cl.
CPC ........... *H01L 2224/05639* (2013.01); *H01L 2224/05644* (2013.01); *H01L 2224/05647* (2013.01); *H01L 2224/05655* (2013.01); *H01L 2224/05684* (2013.01); *H01L 2224/05686* (2013.01); *H01L 2224/13023* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13169* (2013.01); *H01L 2224/1414* (2013.01); *H01L 2224/14131* (2013.01); *H01L 2224/14133* (2013.01); *H01L 2224/14135* (2013.01); *H01L 2224/14517* (2013.01); *H01L 2224/16147* (2013.01); *H01L 2224/48463* (2013.01); *H01L 2224/73257* (2013.01); *H01L 2224/8114* (2013.01); *H01L 2224/81815* (2013.01); *H01L 2224/92* (2013.01); *H01L 2224/9202* (2013.01); *H01L 2224/92227* (2013.01); *H01L 2224/94* (2013.01); *H01L 2225/06513* (2013.01); *H01L 2225/06568* (2013.01); *H01L 2225/06596* (2013.01); *H01L 2924/12042* (2013.01); *H01L 2924/14* (2013.01); *H01L 2924/1461* (2013.01); *H01L 2924/15788* (2013.01); *H01L 2924/384* (2013.01)

(56) References Cited

U.S. PATENT DOCUMENTS

| | | | |
|---|---|---|---|
| 5,973,396 A * | 10/1999 | Farnworth | H01L 23/481 257/698 |
| 5,998,292 A | 12/1999 | Black et al. | |
| 6,038,136 A | 3/2000 | Weber | |
| 6,168,972 B1 | 1/2001 | Wang et al. | |
| 6,207,475 B1 | 3/2001 | Lin et al. | |
| 6,245,595 B1 | 6/2001 | Nguyen et al. | |
| 6,297,548 B1 * | 10/2001 | Moden | H01L 23/13 257/686 |
| 6,400,008 B1 | 6/2002 | Farnworth | |
| 6,774,497 B1 | 8/2004 | Qi et al. | |
| 6,872,594 B2 | 3/2005 | Gebauer et al. | |
| 7,579,215 B2 | 8/2009 | Swirbel | |
| 7,982,298 B1 * | 7/2011 | Kang | H01L 25/03 257/621 |
| 8,021,930 B2 | 9/2011 | Pagaila | |
| 8,030,770 B1 | 10/2011 | Juskey et al. | |
| 8,294,279 B2 | 10/2012 | Chen et al. | |
| 2003/0151139 A1 | 8/2003 | Kimura | |
| 2006/0281223 A1 | 12/2006 | Liu et al. | |
| 2009/0057918 A1 * | 3/2009 | Kim | H01L 25/0657 257/777 |
| 2010/0102444 A1 | 4/2010 | Khor et al. | |
| 2011/0068427 A1 * | 3/2011 | Paek | H01L 24/19 257/433 |
| 2011/0316123 A1 | 12/2011 | Sasaki et al. | |
| 2012/0012990 A1 | 1/2012 | Pagaila et al. | |
| 2012/0199981 A1 | 8/2012 | Jeong et al. | |
| 2013/0012015 A1 | 1/2013 | Oh et al. | |
| 2013/0032925 A1 | 2/2013 | Kitano et al. | |
| 2013/0062757 A1 | 3/2013 | Feger et al. | |
| 2013/0119549 A1 | 5/2013 | Cheng et al. | |
| 2013/0161795 A1 | 6/2013 | Owada | |
| 2014/0284785 A1 * | 9/2014 | Sung | H01L 25/0657 257/692 |

OTHER PUBLICATIONS

Beth Keser et al., "Advanced Packaging: The Redistributed Chip Package", IEEE Transactions on Advanced Packaging, Feb. 2008, pp. 39-43.

Xuejun Fan, "Wafer Level Packaging (WLP): Fan-in, Fan-out and Three-Dimensional Integration", 11th. Int. Conf. on Thermal, Mechanical and Multiphysics Simulation and Experiments in Micro-Electronics and Micro-Systems, Apr. 2010, pp. 1-7.

George A. Riley, "Micro-Posts: Tall, Slender, Stud Bumps", <http://flipchips.com/tutorial/bump-technology/micro-posts-tall-slender-stud-bumps/>, Apr. 2003, 1 page.

Laurie S. Roth et al., "Step 2: Stud Bump Bonding", <http://electroiq.com/blog/2005/02/step-2-stud-bump-bonding/>, Accessed Jun. 30, 2014, 5 pages.

"Dage 4000Plus Bond Tester", <http://www.sinerji-grup.com/bond-tester-systems/dage-4000plus-bond-tester>, Accessed Jun. 30, 2014, 1 page.

"Glass-coated Bonding Wire Targets Copper, Small Diameter Market", <http://electroiq.com/blog/2012/03/glass-coated-bonding-wire-targets-copper-small-diameter-market/>, Accessed Jun. 30, 2014, 4 pages.

U.S. Appl. No. 14/169,254, filed Jan. 31, 2014, entitled "3D Device Packaging Using Through-Substrate Posts".

U.S. Appl. No. 14/303,128, filed Jun. 12, 2014, entitled "3D Device Packaging Using Through-Substrate Posts".

Daniel D. Evans, Jr., "Geometry and Bond Improvements for Wire Ball Bonding and Ball Bumping", 39th International Symposium on Microelectronics (IMAPS 2006) Proceedings, Oct. 8-12, 2006, 7 pages.

PC Magazine, "Detail of flip-chip bond, stud bump in solder well", <http://www.pcmag.com/image_popup/0%2c1740%2ciid=15942%2c00.asp> Accessed Jul. 3, 2014, 1 page.

A.C. Fischer et al., "Low-Cost Through Silicon Vias (TSVs) With Wire-Bonded Metal Cores and Low Capacitive Substrate-Coupling", Micro Electro Mechanical Systems (MEMS), IEEE 23rd International Conference, Jan. 24, 2010, 4 pages.

Non-Final Office Action mailed Mar. 4, 2015 for U.S. Appl. No. 14/169,254, 32 pages.

Non-Final Office Action mailed Mar. 4, 2015 for U.S. Appl. No. 14/303,128, 33 pages.

Final Office Action mailed Aug. 26, 2015 for U.S. Appl. No. 14/303,128, 30 pages.

Final Office Action mailed Aug. 28, 2015 for U.S. Appl. No. 14/169,254, 28 pages.

Non-final office action dated Dec. 4, 2015 in U.S. Appl. No. 14/303,128.

Non-final office action dated Dec. 17, 2015 in U.S. Appl. No. 14/169,254.

Final office action dated May 4, 2016 in U.S. Appl. No. 14/169,254.

Final office action dated May 10, 2016 in U.S. Appl. No. 14/303,128.

Notice of Allowance dated Jul. 7, 2016 in U.S. Appl. No. 14/303,128.

Notice of Allowance dated Jul. 22, 2016 in U.S. Appl. No. 14/169,254.

* cited by examiner

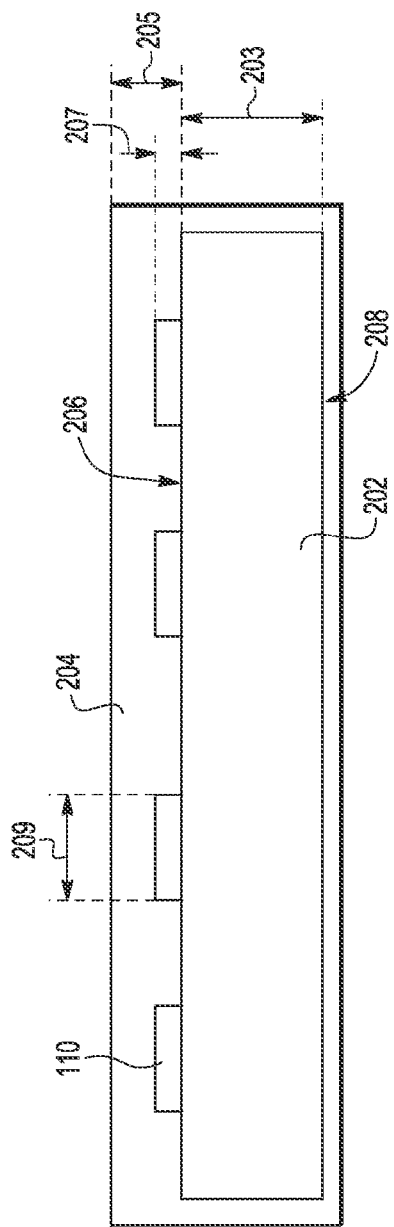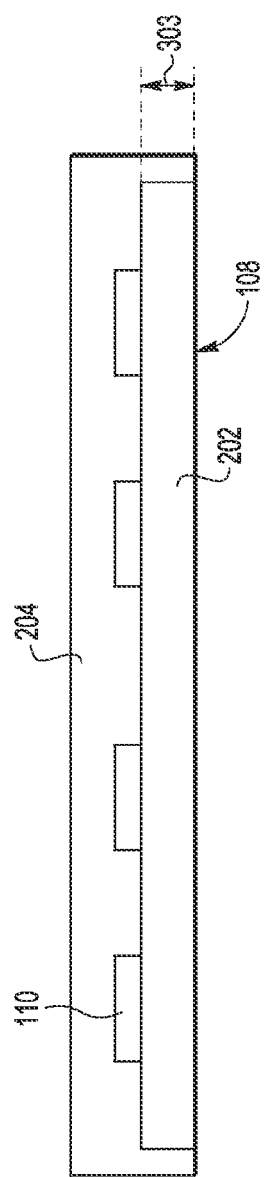

3D DEVICE PACKAGING USING THROUGH-SUBSTRATE PILLARS

BACKGROUND

1. Field of the Disclosure

The present disclosure relates generally to device packaging, and more particularly to three-dimensional (3D) stacked die packaging.

2. Description of the Related Art

Electronic devices often utilize 3D integrated circuit (IC) packaging to stack two or more dice in a package, which provides a smaller footprint compared to a single larger die or side-by-side die connected via an interposer.

A common 3D packaging approach for stacking two dice employs a pillar-to-pillar die stacking technique wherein copper pillar bumps are formed on each die and the two dice are then bonded such that each pillar on one die aligns with, and comes into contact with, a corresponding pillar on the other die so as to form a mechanical and electrical bond. However, the copper pillars must be aligned with precision; if one die is angled relative to the other, or the copper pillar bumps are otherwise misaligned, they may not wet (electrically and mechanically bond). In an attempt to prevent non-wetting, many non-electrically active pillars are added to the dice, increasing the footprint of the technique. Moreover, this pillar-to-pillar die stacking technique creates a large void, or standoff, between the two dice that requires underfill, as well as dams to prevent lateral disbursement of the underfill.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 2 is a cross-section view of a top die after formation of a set of pads at a surface metal layer in accordance with some embodiments.

FIG. 3 is a cross-section view of the top die of FIG. 2 after back-grinding a bottom surface of the top die in accordance with some embodiments.

DETAILED DESCRIPTION

FIGS. 1-7 illustrate example techniques for 3D device packaging using a through-substrate pillar bonding technique to bond two or more dice in a die stack. A "top" die includes a set of pads and an arrangement of a set of access holes formed at a bottom surface of the top die, extending through the top die to the pads. A "bottom" die includes a set of copper pillars disposed at a top surface of the bottom die in an arrangement corresponding to the arrangement of the set of access holes of the first die. The top die and the bottom die are bonded in a stacked configuration by inserting the set of metal pillars into the set of access holes such that each metal pillar contacts a pad, and then may be mechanically and electrically coupled to the pad, such as through a solder reflow process that forms a solder joint between the metal pillar and the corresponding pad.

The terms "top" and "bottom" are used herein to reference the relative positioning or placement of certain components relative to the view orientation of the corresponding figure in which they are depicted. The terms "top" and "bottom" as used herein do not necessarily indicate that a "top" component is above a "bottom" component as such directions and/or components may be flipped, rotated, moved in space, placed in a diagonal orientation or position, placed horizontally or vertically, or similarly modified.

Figure 1:
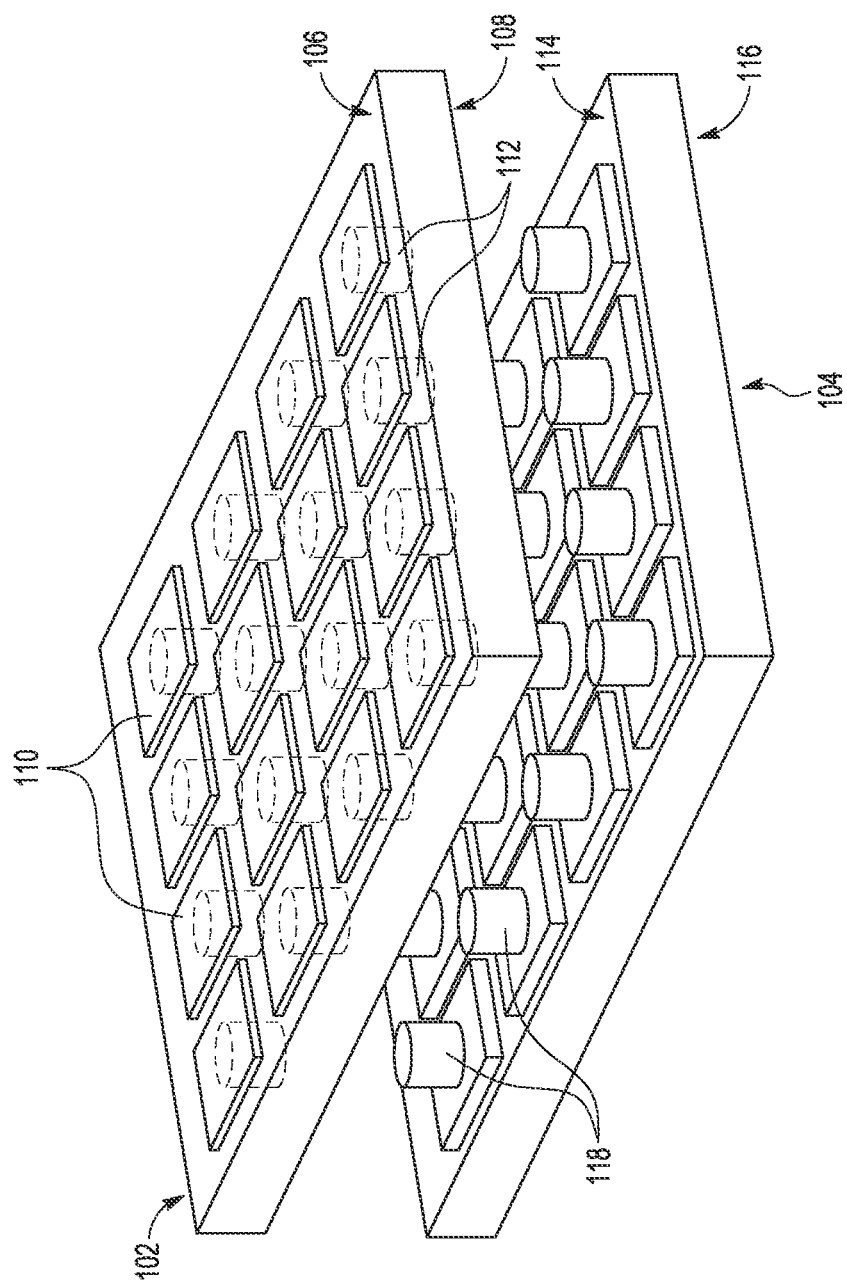
FIG. 1 is an exploded perspective view of a 3D die package implementing a through-substrate pillar bonding technique to bond a top die and a bottom die in accordance with some embodiments.

FIG. 1 illustrates an exploded view of a 3D device package 100 in accordance with some embodiments. The 3D device package 100 typically is configured to be electrically coupled to a printed circuit board (PCB) or other carrier for implementation in an electronic device, which may include, for example, an electronic control system of an automobile or other vehicle, a portable electronic device such as a cellular phone, tablet computer, or notebook computer, a desktop computer, a server, and the like.

in the depicted example, the 3D device package 100 comprises a top die 102 bonded to a bottom die 104 ("top" and "bottom" being relative to the orientation of FIG. 1). Each of the top die 102 and the bottom die 104 comprises one or more substrate layers upon which semiconductor integrated circuit devices or microelectromechanical systems (MEMS) are formed during a front-end-of-line (FEOL) process and one or more metal layers upon which metal interconnects are formed during a back-end-of-line (BEOL) process, The one or more substrate layers can comprise, for example, a single crystal silicon die, a composite wafer of an insulating substrate, such as an epitaxial die, a silicon-on-insulator (SOI) die, or a liquid crystal display (LCD) glass substrate and a semiconductor layer, and the like.

The top die 102 comprises two opposing major surfaces, labeled top surface 106 and bottom surface 108. The top die 102 includes a set of pads 110 disposed in a specified arrangement at one of the metal layers proximate to the top surface 106. For ease of illustration, the set of pads 110 are illustrated as formed at the top metal layer of the top die 102, but in other embodiments the set of pads 110 may be formed at a lower metal layer, or above the top metal layer. The top die 102 further includes a set of access holes 112 in an arrangement compatible with the arrangement of pads 110 such that each access hole 112 is coaxially aligned with a corresponding pad 110 and extends from the bottom surface 108 to the underlying surface of the corresponding pad 110. In some embodiments, the walls of the access holes 112 are substantially perpendicular (90 degrees+/−10 degrees) to the bottom surface 108, thereby allowing a higher density of such access holes. In some embodiments, the bottom surface 108 corresponds with a backside of the top die 102, and the access holes 112 are formed at the backside of the top die 102.

The bottom die 104 likewise comprises two major opposing surfaces, labeled top surface 114 and bottom surface 116.

The bottom die 104 includes a set of metal pillars 118 disposed at the top surface 114 in an arrangement corresponding to the arrangement of the access holes 112. The set of metal pillars 118 extend away from the bottom die 104 in a direction substantially perpendicular to the top surface 114. For ease of illustration, the metal pillars 118 are described herein in the example context of copper (Cu) pillars, but in other embodiments the metal pillars 118 may be composed of other metals, such as aluminum (Al), gold (Au), silver (Ag), platinum (Pt), nickel (Ni), or a combination of metals. The metal pillars 118 and the access holes 112 are dimensioned such that the metal pillars 118 can be inserted into the access holes 112 when the top die 102 and the bottom die 104 are stacked or bonded to form the 31) device package 100, as described below. In some embodiments, a layer of dielectric may be formed on the inside surface of the access holes 112 to provide insulation between the metal pillars 118 of the bottom die 104 and the substrate of the top die 102.

For ease of illustration, the sizes of the pads 110, access holes 112, and metal pillars 118 are exaggerated relative to the dice 102, 104. Moreover, although FIG. 1 depicts sixteen pads 110 in a uniform 4×4 grid arrangement (as well as sixteen access holes 112. and sixteen metal pillars 118 in corresponding 4×4 grid arrangements, in typical implementations the numbers of pads 110, access holes 112, and metal pillars 118 typically are much greater than the sets of sixteen of each as shown, and these components may be compatibly arranged in arrangements other than a grid (e.g., an approximate ring, perimeter, checkerboard pattern, etc).

Although depicted in an exploded view in FIG. 1, during fabrication of the 3D device package 100, the top die 102 and the bottom die 104 are bonded together with the bottom surface 108 of the top die 102 facing the top surface 114 of the bottom die 104. The corresponding arrangements of the set of metal pillars 118, the set of access holes 112, and the set of pads 110 result in the insertion of each metal pillar 118 into a corresponding access hole 112 during the die bonding process. Moreover, the height of the metal pillars 118 is compatible with the substrate thickness of the top die 102 between the metal layer containing the set of pads 110 and the bottom surface 108 such that the metal pillar 118 is brought into contact with the pad 110 overlying the corresponding access hole 112 during the die stacking process. The metal pillars 118 may be tipped with solder material so that after the dice 102, 104 are stacked, a solder reflow process may be performed to form a solder joint between the metal pillar 118 and the pad 110, thus forming a mechanical and electrical bond between the metal pillar 118 and the corresponding pad 110.

With electrical pathways formed between the top die 102 and the bottom die 104 via the pads 110 and the metal pillars 118, some or all of the pads 110 and the metal pillars 118 may be used to conduct signaling or power between the dice 102, 104. In such instances, the pads 110 are connected to the metal interconnect structure formed in the metal layers of the die 102 and the metal pillars 118 are connected to the metal interconnect structure formed in the metal layers of the die 104. Power and signaling therefore may be conducted between the top die 102 and the bottom die 104 via these metal interconnect structures, the metal pillars 118, and the pads 110. Moreover, in some instances, some or all of the metal pillar-pad junctions may be electrically inactive, that is, not used for conducting signaling or power between the dice 102, 104, and instead used solely for bolstering the mechanical bonding between the dice 102, 104 or otherwise bolstering the structural integrity of the resulting 3D device package 100. In such instances, one or both of the metal pillar 118 and the pad 110 of an electrically-inactive pillar-pad junction may be electrically isolated from the other metal interconnects of the corresponding die.

As illustrated with greater detail below with reference to FIG. 5, this front-through-back approach of connecting the metal pillars 118 of the bottom die 104 to the pads 110 of the top die 102. through the substrate of the top die 102 (that is, through the "back end" of the top die 102) reduces the risk of non-wetting pillar connections compared to conventional pillar-to-pillar stacking approaches. Moreover, this approach reduces the standoff distance between the bottom surface 108 of the top die 102 and the top surface 114 of the bottom die 104, and thus facilitates the fabrication of a more compact die stack while reducing or eliminating the need for underfill between the two dice, as well as the need for dam structures to contain such underfill between the two dice.

FIGS. 2-6 sequentially illustrate an example process of fabricating the 3D device package 100 using a through-substrate pillar bonding. As with the view depicted in FIG. 1, the dimensions of the metal pillars, access holes, and pads are exaggerated relative to other features of the dice 102, 104 for purposes of illustration.

FIG. 2 illustrates a cross-section view of a workpiece 200 that ultimately forms the top die 102 of FIG. 1 in accordance with some embodiments. In the depicted stage, a die 202 (corresponding to the top die 102) having an initial thickness 203 has been singulated from a wafer and encapsulated in an encapsulating material 204, such as a heat-curable epoxy-based resin. In some embodiments the encapsulating material 204 may be applied before die singulation and thus the encapsulating material 204 may cover only the top surface 206 (corresponding to the top surface 106, FIG. 1) of the die 202 to a thickness 205, while in other embodiments the die 202 may be encapsulated after singulation, and thus the encapsulating material 204 may cover the top surface 206, the opposing bottom surface 208, and side surfaces of the die 202. An example range of the die thickness 203 10-300 µm, and an example range of the encapsulant thickness 205 at the top surface 206 is 50-400 µm.

In the depicted example, the pads 110 are formed at the surface, or top, metal layer of the die 202, and thus the encapsulating material 204 may directly overlie the pads 110 and any passivation layer formed over the pads 110. The pads 110 may be composed of any of a variety of conductive materials or combinations thereof, such as aluminum, copper, gold, silver, tungsten, nickel, and the like. As noted, the pads 110 are used to contact corresponding metal pillars inserted through the bottom surface 108 of the top die 102, and thus the pads 110 are formed to a thickness 207 suitable to reduce the likelihood of flexion of the pads responsive to this contact. To illustrate, a pad thickness 207 of at least 5,000 angstroms has been found to sufficiently guard against excessive flexion of the pads 110. Moreover, the pads 110 have a width 209 greater than the diameter of the access holes 112 (FIG. 1) formed thereunder, and thus permitting the pads 110 to sufficiently bridge over the openings of the access holes 112. An example range of the pad width 209 is 20-200 µm.

FIG. 3 illustrates a cross-section view of the workpiece 200 after backgrinding of the die 202 at the bottom surface 208 (FIG. 2), and any encapsulant material 204 that may have initially overlain the bottom surface 208. The backgrinding may be performed using any of a variety of suitable techniques, for example mechanical backgrinding, chemical backgrinding, and the like. In some instances, the backgrinding is performed on a wafer prior to die singulation, and in other instances the backgrinding may be performed on the die 202 after singulation. The backgrinding reduces the distance between the bottom surface 108 of the top die 102 and the underside of the pads 110 to a reduced thickness 303 that corresponds to a height of the metal pillars 118 (FIG. 1) less a specified standoff between the bottom surface 108 of the top die 102 (FIG. 1) and the top surface 114 (FIG. 1) of the bottom die 104 (FIG. 1). That is, if the pads 110 are disposed at a top surface 206 of the die 202, the die 202 is background to a reduced thickness 303 so that when the workpiece 200 (as the top die 102) is bonded to the bottom die 104, the metal pillars 118 reach the undersides of the pads 110 while a bottom surface 108 of the die 202 is separated from the top surface 114 of the bottom die 104 by a specified standoff distance.

Figure 4:
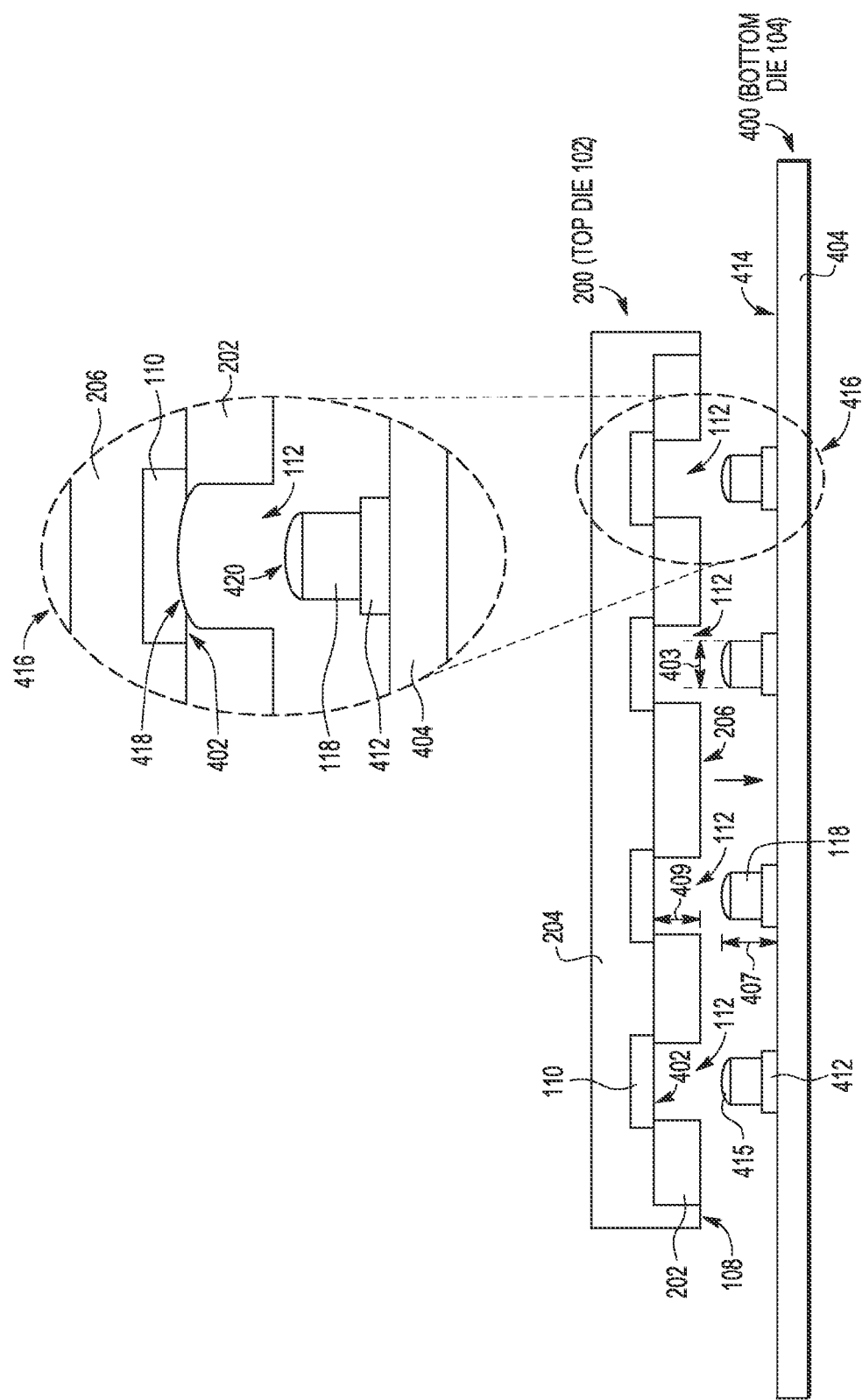
FIG. 4 is a cross-section view of the top die of FIG. 3 after formation of a set of access holes and a cross-section view of a bottom die having a set of metal pillars formed in an arrangement compatible with the set of access holes in accordance with some embodiments.

FIG. 4 illustrates cross-section views of the workpiece 200 (corresponding to the top die 102) and a workpiece 400 (corresponding to the bottom die 104) in the process of stacking or bonding the workpieces 200, 400. In the depicted view, the set of access holes 112 have been formed at the bottom surface 108 of the encapsulated die 202. Each access hole 112 extends substantially perpendicular from the bottom surface 108 to an underlying surface 402 of a corresponding pad 110 of the set of pads 110. The access holes 112 may be formed using any of a variety of suitable techniques, such as etching, mechanical drilling, laser ablation, and the like. In some embodiments, the bottom surface 108 corresponds to a backside of the encapsulated die 202, and the access holes 112 are formed at the backside of the encapsulated die 202.

The workpiece 400 comprises a die 404 (corresponding to the bottom die 104 of FIG. 1) having the set of metal pillars 118 formed at a top surface 414 of the die 404 in an arrangement compatible with the arrangement of pads 110 and access holes 112 in the workpiece 200. The metal pillars 118 may be formed using any of a variety of conventional pillar formation techniques. In some embodiments, the metal pillars 118 are seated on a base 412. The metal pillars 118 each include a contact surface, which may comprise a solder deposit 415 to create a solder joint between the metal pillar 118 and the pad 110 once the workpieces 200, 400 have been stacked and bonded. The metal pillars 118 have a diameter 403 (e.g., 5-150 μm) less than a diameter 405 (e.g., 5.1-155 μm) of the access holes 112 and a height 407 (e.g., 10.2-300.2 μm) greater than a depth 409 (e.g., 10-300.1 μm) of the access holes 112, thereby permitting the metal pillars 118 to extend into the access holes 112 and contact the underlying surfaces 402 of the pads 110.

As illustrated by detail view 416, in some embodiments the end "caps" of the access holes 112. are formed to correspond to the shape of the contact surface 420 of the corresponding metal pillars 118. For example, a concave surface 418 may be formed in the substrate of the top die 202 and in the underlying surface 402 of the pad 110 via, for example, selective etching to correspond to a convex contact surface 420 of the corresponding metal pillar 118. In some embodiments, the concave surface 418 may be formed only in the underlying surface 402 of the pad 110. This concave surface 418 provides a seat to help align the metal pillars 118 in the access holes 406 as the workpieces 200, 400 are joined.

Figure 5:
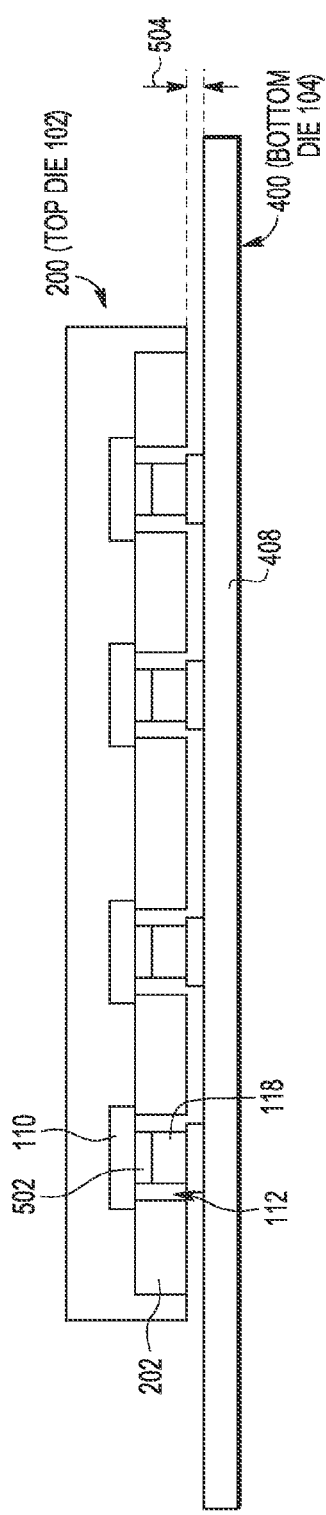
FIG. 5 is a cross-section view of a 3D package formed by the bonding of the top die and bottom die of FIG. 4 in accordance with some embodiments.

FIG. 5 illustrates a cross-section view of the 3D device package 100 resulting from the bonding of the workpiece 200 (representing the top die 102) and the workpiece 400 (representing the bottom die 104). At the depicted stage, the metal pillars 118 have been inserted into the corresponding access holes 112. such that the contact surface 420 of each metal pillar 118 is brought into contact with the underlying surface 402 (FIG. 4) of the corresponding pad 110 and a solder reflow is performed to create a solder joint 502 between the metal pillar 118 and the corresponding pad 110, and thus electrically and mechanically coupling metal pillars 118 with the corresponding pads 110. As illustrated in FIG. 5, using this through-substrate pillar bonding technique, the metal pillars 118 and pads 110 provide mechanical and electrical connections between the dice 102, 104 in a manner that brings the facing surfaces of the dice 102, 104 closer together, resulting in a reduced standoff height 504 between the dice 102, 104, which in turn reduces or eliminates the need for underfill and underfill-containing dam structures, as well as provides for more reliable wetting of the metal pillars 118 during the bonding process.

Figure 6:
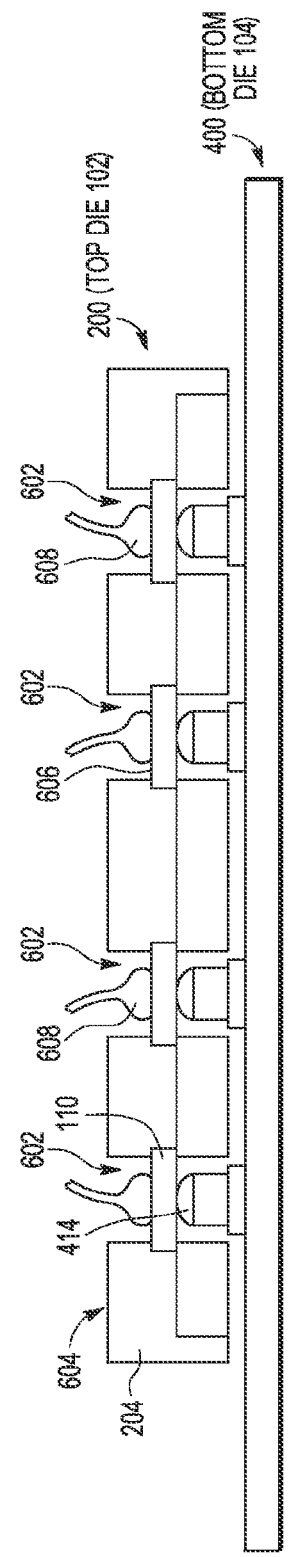
FIG. 6 is a cross-section view of the 3D package of FIG. 5 having a set of wire bonds formed on the pads of the top die via pad openings formed in an encapsulant layer of the top die in accordance with some embodiments.

FIG. 6 illustrates a cross-section view of a 3D device package 600 in which pad openings for test probing or wire bond formation may be formed. In the depicted embodiment, the 3D device package 600 was formed in accordance with the process described above with reference to FIGS. 1-5. As a further processing step, to provide access to the pads 110 a set of pad openings 602 are formed to extend from a top surface 604 of the encapsulant material 204 to top surfaces 606 of some or all of the pads 110. The pad openings 602 may be formed using etching, laser ablation, mechanical and the like. These pad openings 602 may be used to provide test probes access to the pads 110 during a test process, or to facilitate the formation of wire bonds 608 with the pads 110.

Figure 7:
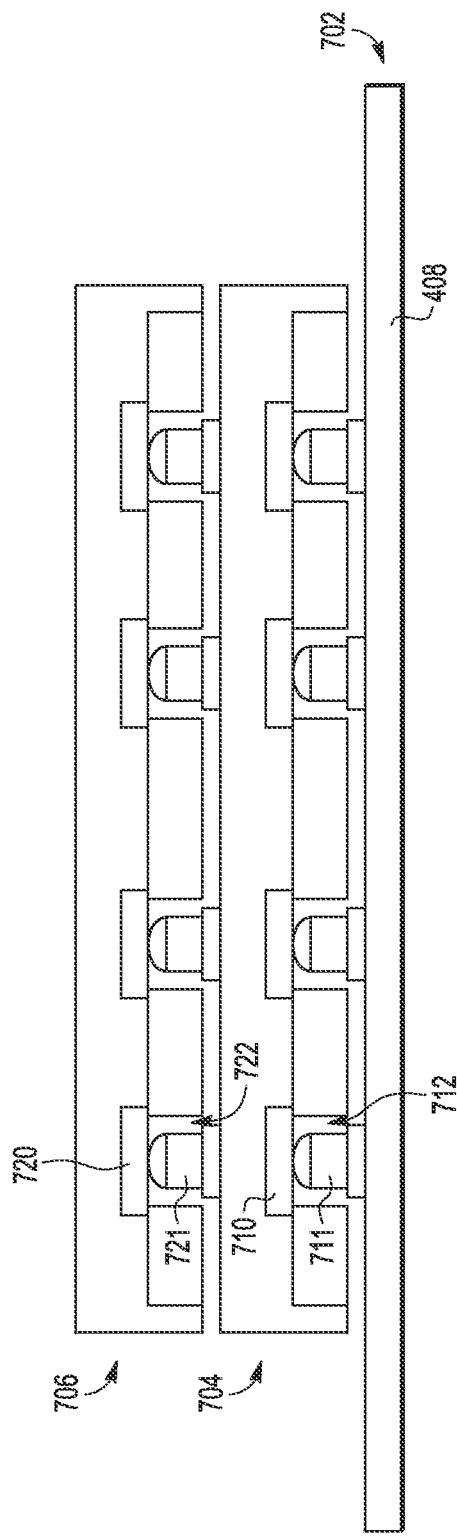
FIG. 7 is a cross-section view of a 3D package having three dice stacked and bonded using a through-substrate pillar bonding technique in accordance with some embodiments.

FIG. 7 illustrates a 3D device package 700 formed from three dice stacked in accordance with the through-substrate pillar bonding technique described herein. As illustrated, the 3D device package 700 is formed from three dice 702, 704, 706, with the die 702 having a set of metal pillars 711 bonded to pads 710 of the die 704 via access holes 712 formed at the backside of the die 704. Similarly, the die 704 has a set of metal pillars 721 formed at the topside of the die 704, and which are bonded to pads 720 of the die 706 via access holes 722 formed at the backside of the die 706. While in the present example the metal pillars 711 of die 702 align with the metal pillars 721 of die 704, in other embodiments, the metal pillars 711 of die 702 do not align with the metal pillars 721 of die 704, and the metal pillars of any given die in a 3D device package need not be arranged to correspond with the metal pillars of another die in the stack. In some embodiments, die 704 may have metal pillars 721 formed directly on the pads 710 such that the metal pillars 721 are electrically and mechanically coupled to the pads 710. This same process may be extended to stack more than three die. Furthermore, the through-substrate pillar bonding technique may be employed in combination with other die bonding techniques to form a multiple-die stack in a 3D device package.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
stacking a first semiconductor die with a second semiconductor die, the first semiconductor die comprising a first set of access holes extending from a first surface of the first semiconductor die to a first set of pads at a metal layer of the first semiconductor die and the second semiconductor die comprising a first set of metal pillars, each metal pillar of the first set of metal pillars extending from a surface of the second semiconductor die to a first surface of a corresponding pad of the first set of pads via a corresponding access hole of the first set of access holes; and
bonding the first semiconductor die and the second semiconductor die such that the metal pillars of the first set of metal pillars are in electrical contact with the corresponding pads of the first set of pads.

2. The method of claim 1, further comprising:
encapsulating the first semiconductor die with an encapsulating material; and
forming a set of pad openings, each pad opening of the set of pad openings extending from a surface of the encapsulating material to a second surface of a corresponding pad of the first set of pads.

3. The method of claim 2, further comprising:
forming a wire bond with a pad of the first set of pads via a corresponding pad opening of the set of pad openings.

4. The method of claim 1, further comprising:
performing a solder reflow to form solder joints coupling the metal pillars of the first set of metal pillars with the corresponding pads of the first set of pads.

5. The method of claim 1, further comprising:
stacking a third semiconductor die with the first semiconductor die, the third semiconductor die comprising a second set of access holes extending from a surface of the third semiconductor die to a second set of pads at a metal layer of the third semiconductor die and the first semiconductor die comprising a second set of metal pillars, each metal pillar of the second set of metal pillars extending from a second surface of the first semiconductor die to a surface of a corresponding pad of the second set of pads via a corresponding access hole of the second set of access holes.

6. A method comprising:
forming a first set of pads at a metal layer of a first semiconductor die;

forming a set of access holes in a first arrangement at the first semiconductor die, each access hole of the set of access holes extending from a surface of the first semiconductor die to a corresponding pad of the set of pads; and
bonding the first semiconductor die to a second semiconductor die, the second semiconductor die comprising a set of metal pillars disposed at a surface of the second semiconductor die in a second arrangement corresponding to the first arrangement, the set of metal pillars extending into the first semiconductor die via the set of access holes such that each metal pillar of the set of metal pillars contacts a first surface of a corresponding pad of the set of pads.

7. The method of claim 6, wherein bonding the first semiconductor die to the second semiconductor die comprises:
performing a solder reflow to form solder joints coupling the metal pillars with the corresponding pads.

8. The method of claim 6, wherein the first surface of the first semiconductor die is characterized as a backside of the first semiconductor die.

9. The method of claim 6, wherein forming the set of access holes comprises:
forming, at each access hole of the set of access holes, a concave surface at the first surface of the corresponding pad.

10. The method of claim 6, wherein forming the set of access holes comprises forming the set of access holes with walls substantially perpendicular to the surface of the first semiconductor die.

11. The method of claim 6, further comprising:
encapsulating the first semiconductor die with an encapsulating material; and
forming a set of pad openings, each pad opening of the set of pad openings extending from a surface of the encapsulating material to a second surface of a corresponding pad of the set of pads.

12. The method of claim 11, further comprising:
forming a wire bond with the second surface of a pad of the set of pads via a corresponding pad opening of the set of pad openings.

13. The method of claim 6, wherein the metal layer comprises a surface metal layer of the first semiconductor die.

14. A device package comprising:
a first semiconductor die comprising:
a first metal layer comprising a first set of pads; and
a set of access holes in a first arrangement, each access hole of the set of access holes extending from a first surface of the first semiconductor die to a first surface of a corresponding pad of the first set of pads; and
a second semiconductor die bonded to the first semiconductor die, the second semiconductor die comprising:
a first set of metal pillars disposed in a second arrangement corresponding to the first arrangement at a surface of the second semiconductor die that faces the surface of the first semiconductor die, each metal pillar of the first set of metal pillars extending to and in contact with the first surface of a corresponding pad of the set of pads via a corresponding access hole of the set of access holes.

15. The device of claim 14, wherein each metal pillar of the set of metal pillars is electrically and mechanically coupled to the corresponding pad via a solder joint.

16. The device of claim 14, wherein at least one access hole of the set of access holes comprises a concave surface at least partially formed at the first surface of the corresponding pad of the set of pads.

17. The device of claim 14, further comprising:
an encapsulating material encapsulating the first semiconductor die; and
a set of pad openings formed through the encapsulating material to a second surface of a pad of the set of pads.

18. The device of claim 17, further comprising:
a wire bond disposed in at least one pad opening of the set of pad openings at the second surface of the pad.

19. The device of claim 14, wherein the first surface of the first semiconductor die is characterized as a backside of the first semiconductor die.

20. The device of claim 14, wherein:
the first semiconductor die further comprises:
a second set of metal pillars disposed in a third arrangement at a second surface of the first semiconductor die; and
the device package further comprises:
a third semiconductor die bonded to the first semiconductor die, the third semiconductor die comprising:
a second metal layer comprising a second set of pads; and
a second set of access holes in a fourth arrangement corresponding to the third arrangement, each access hole of the second set of access holes extending from a surface of the third semiconductor die that faces the second surface of the first semiconductor die to a surface of a corresponding pad of the second set of pads such that each metal pillar of the second set of metal pillars extends, via a corresponding access hole of the second set of access holes, to and in contact with the surface of the corresponding pad of the second set of pads.

* * * * *